United States Patent
Lee et al.

(10) Patent No.: US 8,338,295 B2
(45) Date of Patent: Dec. 25, 2012

(54) METHOD OF FABRICATING METAL INTERCONNECTION AND METHOD OF FABRICATING IMAGE SENSOR USING THE SAME

(75) Inventors: Jeong-Ho Lee, Seoul (KR); Young-Hoon Park, Suwon-si (KR); Sang-Il Jung, Seoul (KR); Jun-Seok Yang, Seongnam-si (KR); An-Chul Shin, Goyang-si (KR); Min-Young Jung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/206,703

(22) Filed: Aug. 10, 2011

(65) Prior Publication Data

US 2011/0294288 A1 Dec. 1, 2011

Related U.S. Application Data

(62) Division of application No. 12/274,040, filed on Nov. 19, 2008, now Pat. No. 8,026,171.

(30) Foreign Application Priority Data

Nov. 26, 2007 (KR) .................. 10-2007-0121000

(51) Int. Cl.
*H01L 21/441* (2006.01)
(52) U.S. Cl. .. 438/669; 438/622; 438/742; 257/E21.323
(58) Field of Classification Search .......... 438/622–624, 438/669–672, 676, 74; 257/E21.313
See application file for complete search history.

(56) References Cited

U.S. PATENT DOCUMENTS

| | | | |
|---|---|---|---|
| 2005/0118828 A1* | 6/2005 | Chien et al. | ................... 438/710 |
| 2006/0189133 A1* | 8/2006 | Dimitrakopoulos et al. | . 438/687 |
| 2006/0284226 A1* | 12/2006 | Park et al. | ..................... 257/296 |

* cited by examiner

*Primary Examiner* — Thanhha Pham
(74) *Attorney, Agent, or Firm* — F. Chau & Associates, LLC

(57) ABSTRACT

A method of fabricating a metal interconnection and a method of fabricating image sensor using the same are provided. The method of fabricating a metal interconnection including forming a interlayer dielectric layer on a substrate, forming an interconnection formation region in the interlayer dielectric layer, performing an ultraviolet (UV) treatment on the substrate after the interconnection formation region is formed and forming a metal interconnection in the interconnection formation region.

7 Claims, 15 Drawing Sheets

METHOD OF FABRICATING METAL INTERCONNECTION AND METHOD OF FABRICATING IMAGE SENSOR USING THE SAME

CROSS REFERENCE TO RELATED APPLICATION

This application is a divisional of U.S. patent application Ser. No. 12/274,040 filed on Nov. 19, 2008, now U.S. Pat. No. 8,026,171 which, in turn, claims priority from Korean Patent Application No. 10-2007-0121000 filed on Nov. 26, 2007, the disclosures of which are each incorporated by reference herein in their entireties.

BACKGROUND OF THE INVENTION

1. Technical Field

The present disclosure relates to a method of fabricating a metal interconnection and to a method of fabricating an image sensor using the same.

2. Description of the Related Art

An image sensor may transform optical images into electrical signals. Recent advances in computer and communication industries have led to a strong demand for high performance image sensors in various consumer electronic devices including, for example, digital cameras, camcorders, PCS (Personal Communication System), game devices, security cameras, and medical micro-cameras.

Specifically, a Metal Oxide Semiconductor (MOS) image sensor can be driven easily and implemented using various scanning methods. Also, the size of a product can be minimized as digital signal-processing circuits can be integrated into a single chip, and the fabricating cost can be reduced as MOS process technology can be reused. In addition, low power consumption makes it easy to apply MOS image sensors to battery-powered products. Therefore, with the advances in implementation of high resolution MOS image sensors, the use of MOS image sensors has rapidly increased.

Moreover, a MOS image sensor may include a photoelectric transformation device which absorbs incident light and accumulates the corresponding charge and multi-layer metal interconnections to output charges accumulated in the photoelectric transformation device. For the metal interconnections, aluminum or copper interconnections are widely used. As MOS image sensors become miniaturized, the copper interconnections are becoming more widely used as the copper interconnection may have lower specific resistance and can be formed in narrow patterns.

When forming copper or aluminum interconnections, a plasma etching process is used, and such process can cause damage to the photoelectric transformation device which can increase a dark level of output signals.

SUMMARY OF THE INVENTION

The exemplary embodiments of the present invention may provide a method of fabricating a metal interconnection to fix the damage caused by the plasma etching process.

The exemplary embodiments of present invention may also provide a method of fabricating an image sensor using the method of fabricating the metal interconnection.

However, exemplary embodiments of the present invention are not restricted to the one set forth herein. The exemplary embodiments of the present invention will become more apparent to one of ordinary skill in the art to which the present invention pertains by referencing the detailed description of the present invention given below.

In accordance with an exemplary embodiment of the present invention, a method of fabricating a metal interconnection is provided. The method includes forming a interlayer dielectric layer on a substrate, forming an interconnection formation region in the interlayer dielectric layer, performing an ultraviolet (UV) treatment on the substrate after the interconnection formation region is formed and forming a metal interconnection in the interconnection formation region.

In accordance with an exemplary embodiment of the present invention, a method of fabricating a metal interconnection is provided. The method includes forming an interlayer dielectric layer on a substrate, forming a interconnection metal layer on the interlayer dielectric layer, patterning the interconnection metal layer to form a metal interconnection on the interlayer dielectric layer and performing an ultraviolet (UV) treatment on the substrate after the metal interconnection is formed.

In accordance with an exemplary embodiment of the present invention, a method of fabricating an image sensor is provided. The method includes forming a photoelectric transformation device on a substrate, forming an interlayer dielectric layer on the substrate which the photoelectric transformation device is formed on, forming an interconnection formation region in the interlayer dielectric layer by plasma etching, performing an ultraviolet (UV) treatment on the substrate after the interconnection formation region is formed and foaming a metal interconnection in the interconnection formation region.

In accordance with another exemplary embodiment of the present invention, a method of fabricating an image sensor is provided. The method includes forming a photoelectric transformation device on a substrate, forming an interlayer dielectric layer on the substrate which the photoelectric transformation device is formed on, forming a interconnection metal layer on the interlayer dielectric layer, patterning the interconnection metal layer to form a metal interconnection on the interlayer dielectric layer by plasma etching and performing an ultraviolet (UV) treatment on the substrate after the metal interconnection is formed.

BRIEF DESCRIPTION OF THE DRAWINGS

Exemplary embodiments of the present invention can be understood in more detail from the following detailed description taken in conjunction with the attached drawings in which.

DETAILED DESCRIPTION OF THE EXEMPLARY EMBODIMENTS OF THE INVENTION

Figure 1:
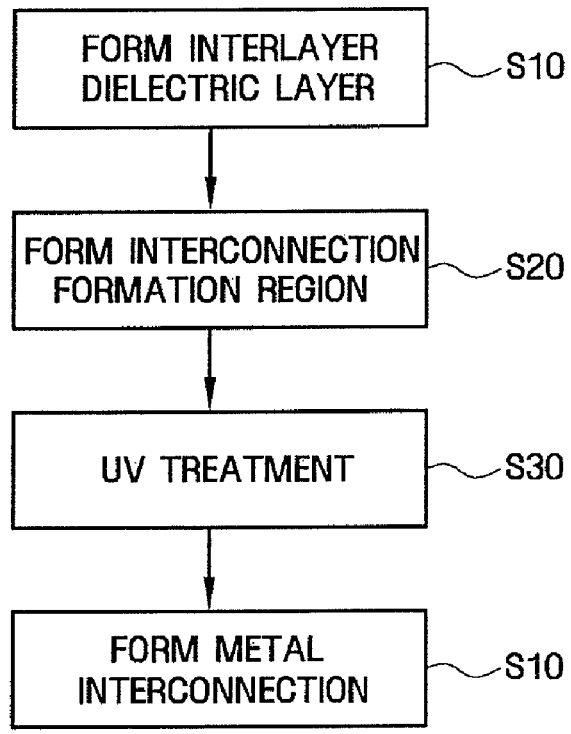
FIG. 1 is a flow chart illustrating a method of fabricating a metal interconnection according to an exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It should be understood that, although the terms first, second, and others may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It should be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having the meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary tell is "below" and "beneath" can, therefore, encompass both an orientation of above and below.

In the exemplary embodiments of the present invention, an image sensor is a complementary metal oxide semiconductor (CMOS) image sensor. However, exemplary embodiments of the present invention may be applied not only to an image sensor obtained by CMOS processes, which involve both N-channel metal oxide semiconductor (NMOS) and P-channel metal oxide semiconductor (PMOS) processes, but also to, for example, an image sensor obtained by NMOS processes and an image sensor obtained by PMOS processes.

FIG. 1 is a flow chart illustrating a method of fabricating a metal interconnection according to a first exemplary embodiment of the present invention. FIGS. 2A through 2D are intermediate step sectional views illustrating a method of fabricating the metal interconnection in FIG. 1. Forming a dual damascene interconnection is illustrated in FIGS. 2A through 2D as an example.

Figure 2A:
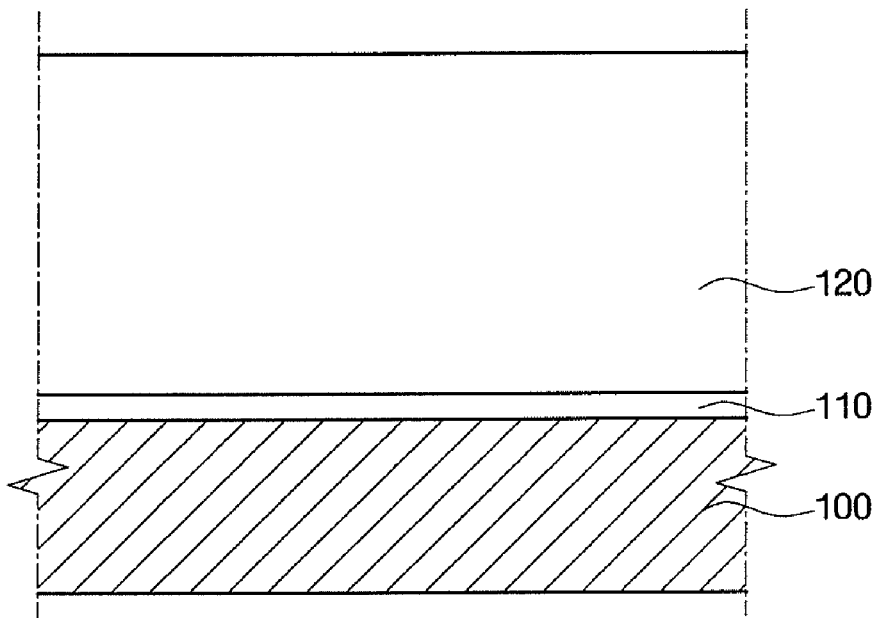
FIGS. 2A through 2D are sectional views of intermediate steps illustrating a method of fabricating the metal interconnection in FIG. 1.

Referring to FIGS. 1 and 2A, a diffusion barrier layer 110 and an interlayer dielectric layer 120 are sequentially formed on a lower metal interconnection 100 which is formed on a substrate S10.

For example, the diffusion barrier layer 110 prevents diffusion of copper. Also, the diffusion barrier layer 110 can act as an etching stopper during an etching process. Thus, the diffusion barrier layer 110 can be used to prevent damage on the lower metal interconnection 100 during etching the interlayer dielectric layer 120 to form an interconnection-forming region, for example, trench and/or via hole and to increase etching precision. This diffusion barrier layer 110 can be formed by, for example, a CVD method (Chemical Vapor Deposition) using silicon nitride (SiN), silicon carbide (SiC), silicon oxynitride (SiON), and silicon cyanide (SiCN).

The interlayer dielectric layer 120 can be formed with, for example, PE-TEOS (Plasma Enhanced-Tetra Ethyl Ortho Silicate), PEOX (Plasma Enhanced Oxide), FSG (Fluoride Silicate Glass), PSG (Phosphor Silicate Glass), BPSG (Boro-PhosphoSilica Glass), or USG (Undoped Silica Glass), and the interlayer dielectric layer 120 can be also formed of a stacked layer of these materials. Typically, the interlayer dielectric layer 120 can be formed by a CVD method.

Figure 2B:
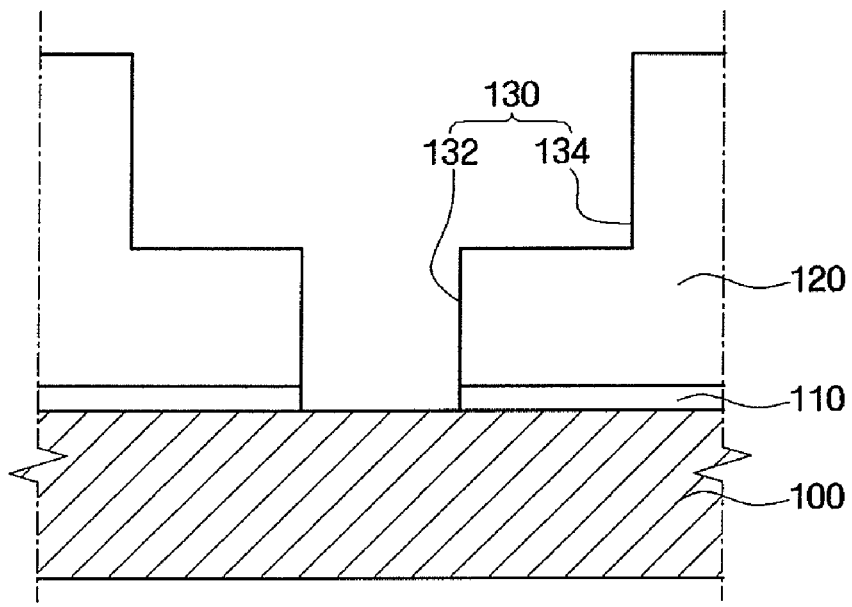

Referring to FIGS. 1 and 2B, an interconnection formation region 130 is formed in the interlayer dielectric layer 120 S20.

The interconnection formation region 130 defines an area to form a metal interconnection. The interconnection formation region 130 illustrated in FIG. 2B is a region to form a dual damascene interconnection, and includes a via hole 132 and a trench 134. The shape of the via hole 132 and the trench 134 is not limited to the shape illustrated in FIG. 2B, and can be, for example, in the shape of rounded corner or can be formed with extensions in vertical and/or a horizontal directions.

For example, the via hole 132 can be formed first in a predetermined area of the interlayer dielectric layer 120, and then the trench 134 which goes through the upper side of the via hole 132 can be formed. Alternatively, the trench 134 can be formed first, and then the via hole 132 can be formed.

In the first exemplary embodiment of the present invention, the interconnection formation region 130 (the via hole 132 and the trench 134) can be formed using, for example, a plasma etching process.

Figure 2C:
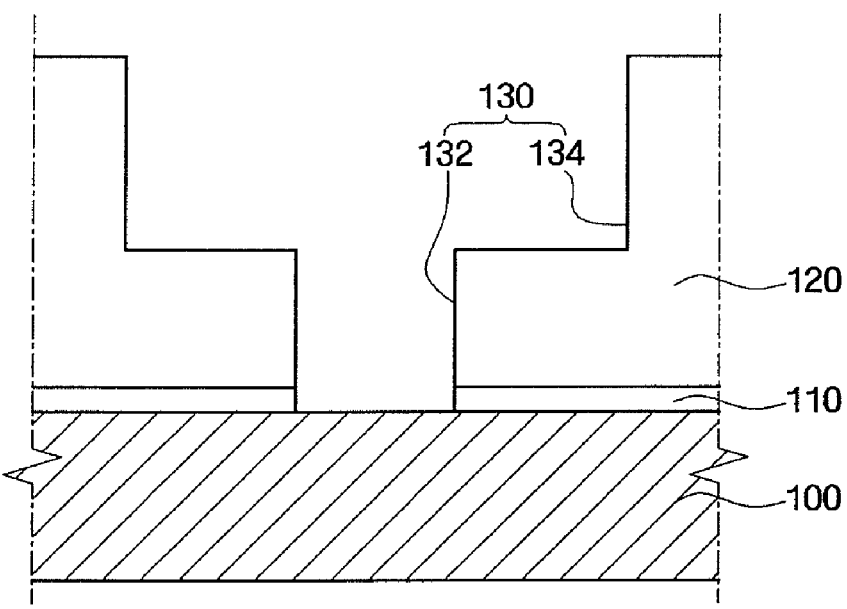

Referring to FIGS. 1 and 2C, a UV treatment 140 is performed on the substrate S30.

In more detailed descriptions, the plasma etching process used to form the interconnection formation region 130 can cause damages to the substrate. For example, such damage can have polarities and can act as a trap during signal transmission using transistors. Thus, malfunctions can be caused in a semiconductor device.

In the first exemplary embodiment of the present invention, the damage described above can be cured by performing UV treatment 140 on the substrate. The UV treatment 140 can be performed, for example, at temperatures between about 50° C. and about 200° C. for about 10 seconds to about 300 seconds, but it is not limited to this. Also, the UV treatment 140 can be performed using, for example, a UV bake equipment but it is not limited to this.

Figure 2D:
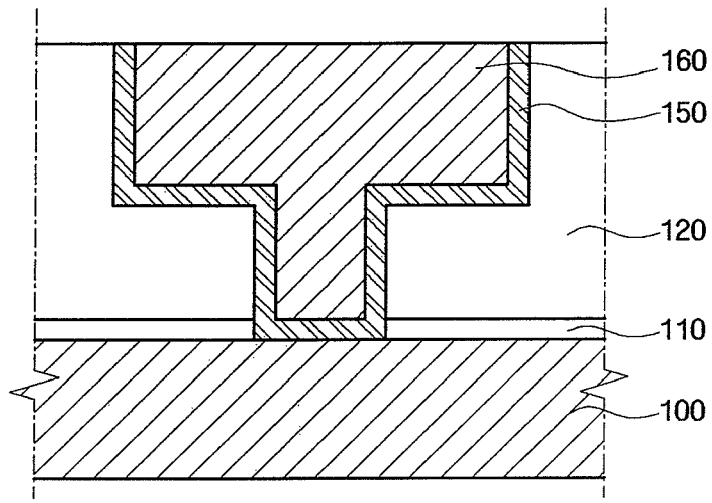

Referring to FIGS. 1 and 2D, a metal interconnection 160 is formed in the interconnection formation region 130 S40.

First, a barrier metal layer 150, a seed layer are conformally formed on the interlayer dielectric layer 120 according to the profile of the interlayer dielectric layer 120. The barrier metal layer 150 prevents diffusion of a metal interconnection. As copper to be used as the metal interconnection 160 has a high diffusion coefficient to materials used in fabricating integrated circuits such as, for example, silicon (Si) and silicon dioxide ($SiO_2$), if the copper is diffused into an insulating layer such as $SiO_2$, the insulating layer may become conductive and the insulating characteristic may deteriorate. The barrier metal layer 150 can be formed of a metal that does not react with copper or copper alloy or a high fusion point metal. For example, the barrier metal layer 150 can be formed of titanium (Ti), tantalum (Ta), tungsten (W), ruthenium (Ru), titanium nitride (TiN), tantalum nitride (TaN), tungsten nitride (WN), titanium zirconium nitride (TiZrN), titanium silicon nitride (TiSiN), tantalum aluminum nitride (TaAlN), tantalum silicon nitride (TaSiN), tantalum silicide ($TaSi_2$), and titanium tungsten (TiW), and it also can be formed of combinations or a stacked layer of these materials. The barrier metal layer 150 can be formed by, for example, physical vapor deposition (PVD), atomic layer deposition (ALD), and chemical vapor deposition (CVD) methods. Typically, the seed layer can be formed by, for example, the PVD method.

Then, a conductive layer is formed thickly enough to fill the interconnection formation region 130 on the interlayer dielectric layer 120. The conductive layer can be formed by a method having beneficial filling characteristics such as, for example, an electroplating method, an electroless plating method, and a MOCVD (Metal Organic Chemical Vapor Deposition) method.

Then the conductive layer and the barrier metal layer 140 are planarized to expose an upper side of the interlayer dielectric layer 120. The planarized conductive layer is a metal interconnection 160 (a dual damascene interconnection in FIG. 2D). To form the planarized layer, a part of the conductive layer and a part of the barrier metal layer 150 can be selectively removed. For example, the planarized layer can be formed by a chemical mechanical polishing (CMP) process with non-selective slurry. Here, for example, a silica abrasive material which can remove different types of layers with the same ratio can be used as a non-selective slurry. Also, the planarized layer can be formed by, for example, a plasma etching process. Alternatively, the planarized layer can be formed by a selective planarization process to each of the conductive layer and the barrier metal layer 150.

A dual damascene interconnection is exemplified and described in FIGS. 2A through 2D but it is not limited to this. The exemplary embodiments of the present invention can be applied to form, for example, a single damascene interconnection, a contact, and a via. That is, the UV treatment can be performed after interconnection formation region for the single damascene interconnection is formed. Also, the UV treatment can be performed after a contact hole or via hole is formed.

Figure 3:
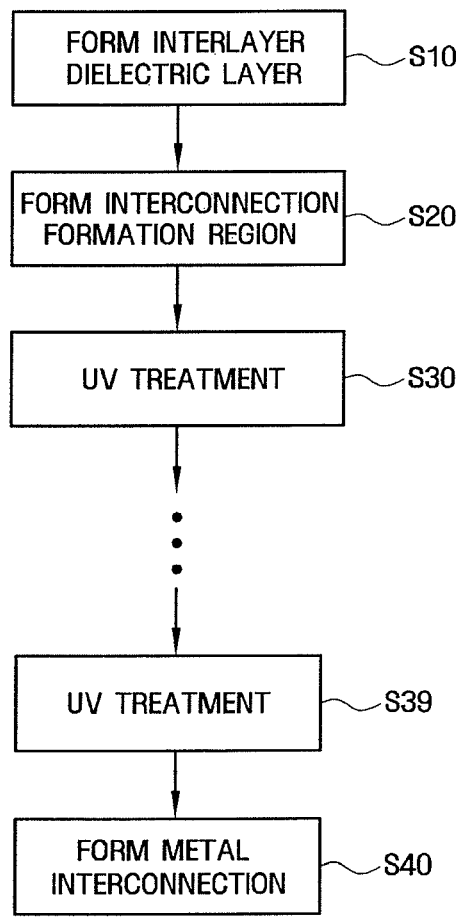
FIG. 3 is a flow chart illustrating a method of fabricating a metal interconnection according to an exemplary embodiment of the present invention.

FIG. 3 is a flow chart illustrating a method of fabricating a metal interconnection according to a second exemplary embodiment of the present invention.

Referring to FIG. 3, a difference between the method of fabricating a metal interconnection according to the second exemplary embodiment of the present invention and the method of fabricating a metal interconnection according to the first exemplary embodiment of the present invention is that the former performs the UV treatment multiple times after forming the interconnection formation region S20 S30-S39. For example, the UV treatment can be performed three, four or five times.

The motivation for performing multiple UV treatments is described as follows. As there is the maximum amount of damage that can be cured with one UV treatment, the amount of damage cured can be limited to a certain threshold even if an UV treatment is performed for an extended period of time. Therefore, performing multiple UV treatments can increase the amount of damage that can be cured.

Multiple UV treatments can be performed at the same treatment temperature for the same treatment period of time. Also, multiple UV treatments can be performed at different treatment temperatures for the same treatment periods of time.

Figure 4:
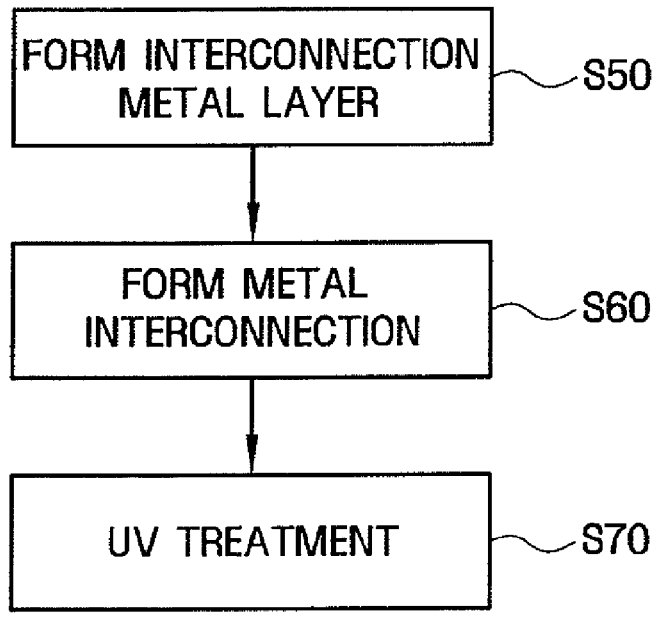
FIG. 4 is a flow chart illustrating a method of fabricating a metal interconnection according to an exemplary embodiment of the present invention.
Figure 5A:
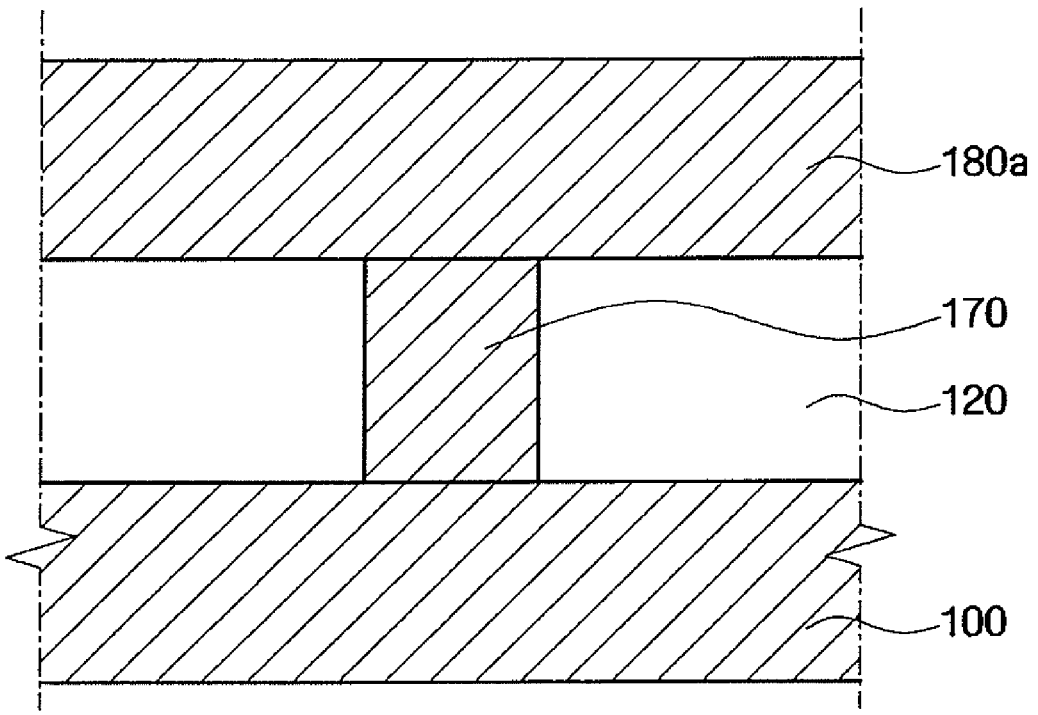
FIGS. 5A through 5C are sectional views of intermediate steps illustrating a method of fabricating the metal interconnection in FIG. 4.
Figure 5B:
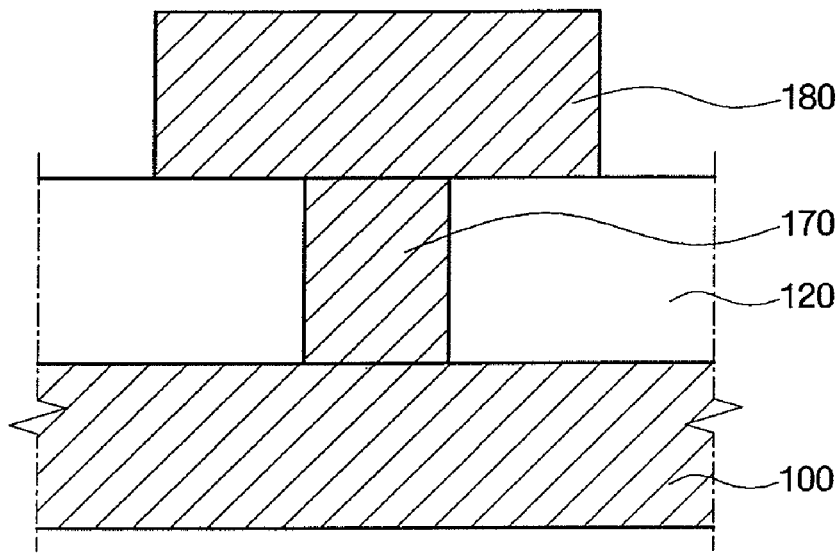
Figure 5C:
Figure 5C:
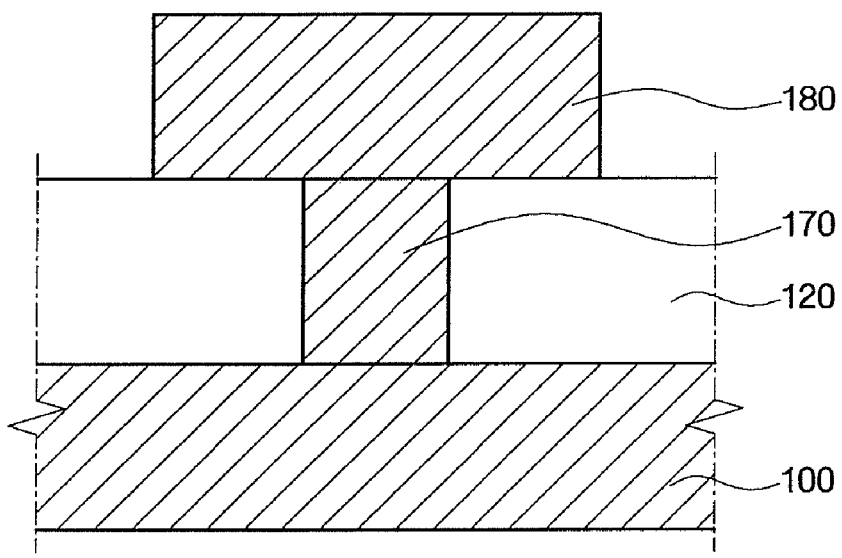

FIG. 4 is a flow chart illustrating a method of fabricating a metal interconnection according to a third exemplary embodiment of the present invention. FIGS. 5A through 5C are intermediate step sectional views illustrating a method of fabricating the metal interconnection in FIG. 4.

Referring to FIGS. 4 and 5A, an interlayer dielectric layer 120 is formed on a lower metal interconnection 100 which is formed on a substrate. A via 170 which is connected to the lower metal interconnection is formed in a partial region of the interlayer dielectric layer 120. An interconnection metal layer 180a is formed on the interlayer dielectric layer 120 where the via 170 is formed in S50. Here, the interconnection metal layer 180a can be formed with, for example, an aluminum layer.

Referring to FIGS. 4 and 5B, a metal interconnection 180 (thus, an aluminum interconnection) is formed on the interlayer dielectric layer 120 by patterning the interconnection metal layer 180a. Here, for example, a plasma etching process can be used for patterning the interconnection metal layer 180a.

Referring to FIGS. 4 and 5C, an UV treatment 190 is performed on the substrate S70. As describe above, the plasma etching process used to pattern the interconnection metal layer 180a can cause damage to the substrate, and such damage can be cured by performing the UV treatment 190 on the substrate. The UV treatment 190 can be performed, for example, at a temperatures between about 50° C. and about 200° C. for about 10 seconds to about 300 seconds but it is not limited to this. Also, the UV treatment 190 can be performed, for example, using UV bake equipment but it is not limited to this.

Figure 6:
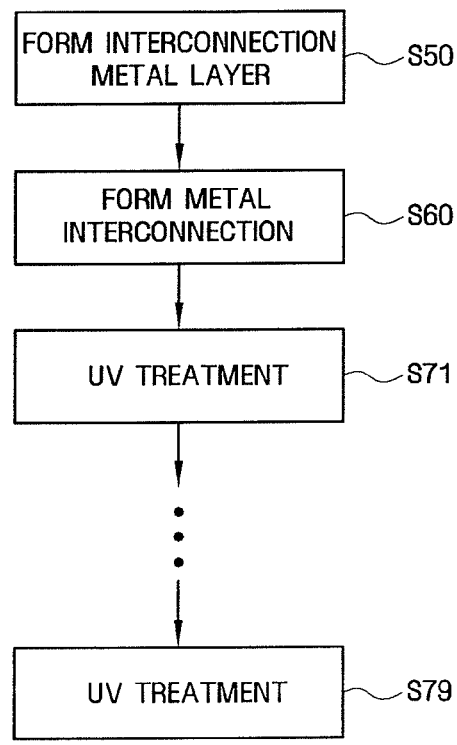
FIG. 6 is a flow chart illustrating a method of fabricating a metal interconnection according to an exemplary embodiment of the present invention.

FIG. 6 is a flow chart illustrating a method of fabricating a metal interconnection according to a fourth exemplary embodiment of the present invention.

Referring to FIG. 6, the difference between the method of fabricating a metal interconnection according to the fourth exemplary embodiment of the present invention and the method of fabricating a metal interconnection according to the second exemplary embodiment of the present invention is that the former performs the UV treatment multiple times after forming a metal interconnection S60 S70-S79. For example, the UV treatment can be performed three, four or five times. The motivation for performing multiple UV treatments is due to the maximum amount of damage that can be cured with one UV treatment. Multiple UV treatments can be performed at the same treatment temperature for the same treatment period of time. Also, multiple UV treatments can be performed at different treatment temperatures for the same treatment periods.

Hereinafter, referring to FIGS. 7 through 10C, a method of fabricating an image sensor using the fabrication method of a metal interconnection illustrated using FIGS. 1 through 6 is described.

Figure 7:
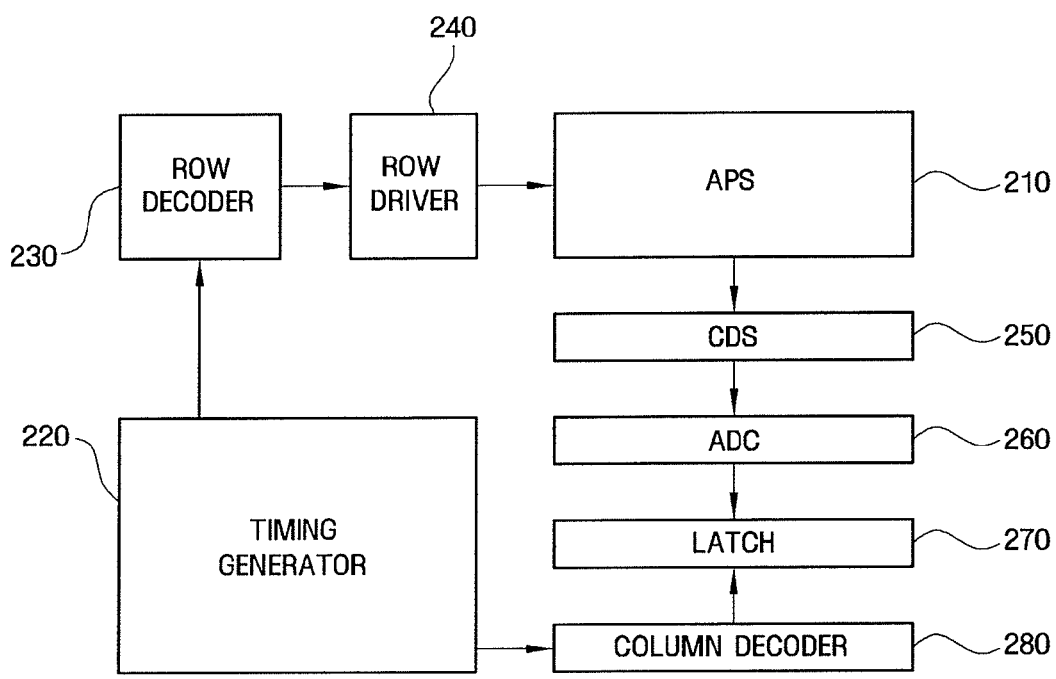
FIG. 7 is a block diagram of an image sensor according to an exemplary embodiment of the present invention.

FIG. 7 is a block diagram of an image sensor according to exemplary embodiments of the present invention. Referring to FIG. 7, an image sensor according to the exemplary embodiments of the present invention includes an active pixel sensor APS array 210 which includes two dimensional arrays of pixels having photoelectric transformation devices, a timing generator 220, a row decoder 230, a row driver 240, a Correlated Double Sampler CDS 250, an Analog to Digital Converter ADC 260, a latch unit 270, and a column decoder 280.

The APS array 210 includes unit pixels arranged in two dimensions. The unit pixels transform photonic images into electrical signals. The APS array 210 is driven by multiple driving signals from the row driver 240 including a row selection signal, a reset signal, and a charge transmission signal. Also, the electrically transformed output signals are delivered to the correlated double sampler 250 through vertical signal lines.

The timing generator 220 provides the row decoder 230 and the column decoder 280 with timing and control signals.

According to the decoding results from the row decoder 230, the row driver 240 provides the pixel sensor array 210 with multiple driving signals to drive unit pixels. Typically, in the case of unit pixels arranged in a matrix fashion, the driving signals are provided to each row.

The correlated double sampler 250 receives the output signals generated from the active pixel sensor array 210 through vertical signal lines, and performs hold and sampling operations. For example, the correlated double sampler 250 double-samples a certain noise level and the signal level generated by the APS array, and outputs the difference level between the noise level and the signal level.

The analog digital converter 260 outputs the digital signals by converting analog signals of the difference level to digital signals.

The latch unit 270 latches digital signals and the latched signals are sequentially sent to an image signal processor according to decoding results from the column decoder 280.

Figure 8:
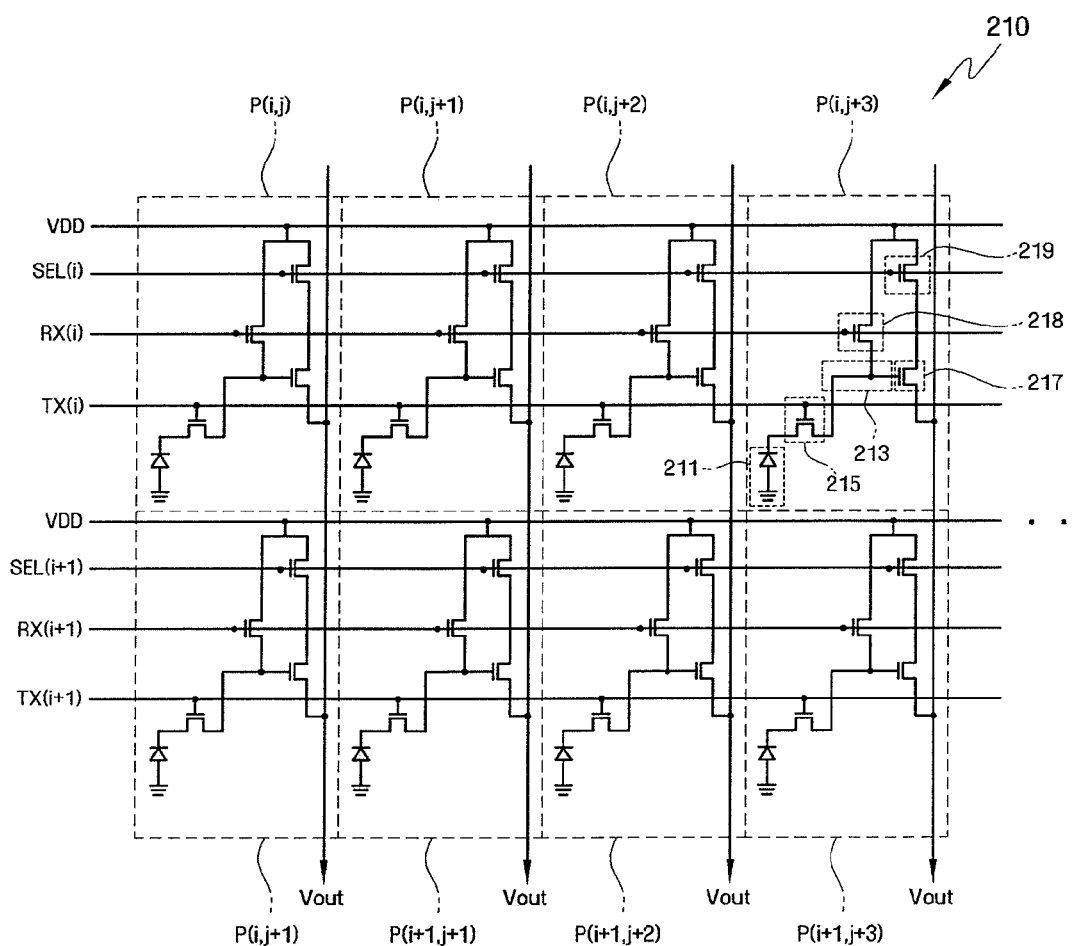
FIG. 8 is an equivalent circuit diagram of the APS array in FIG. 7.

FIG. 8 is an equivalent circuit diagram of the APS array in FIG. 7.

Referring to FIG. 7, pixels P are arranged in a matrix fashion to form the APS array 210. Each pixel P includes a photoelectric transformation device 211, a floating diffusion region 213, a charge transmission device 215, a drive device 217, a reset device 218, and a selection device 219. The functionality of these devices are described using the ith row pixel P(i, j), P(i, j+1), P(i, j+2), P(i, j+3), . . . .

The photoelectric transformation device 211 absorbs incident light and accumulates electric charges corresponding to the amount of the incident light. The photoelectric transformation device 211 can include a photo diode, a photo transistor, a photo gate, a pinned photo diode, and combinations of these devices. In the drawing, a photo diode is shown.

Each photoelectric transformation device 211 is coupled with a charge transmission device 215 which transmits the accumulated charges to the floating diffusion region 213. The Floating Diffusion region FD 213 is a region that transforms charges to voltages, and as it has parasitic capacitances, the charges are cumulatively stored.

The drive device 217, exemplified as a source follower amplifier, amplifies the change of the electrical potential in the floating diffusion region 213 which receives charges accumulated in each charge transmission device 215 and outputs to the output line Vout.

The reset device 218 periodically resets the floating diffusion region 213. The reset device 218 can be comprised of one MOS transistor driven by a bias provided by a reset line RX(i) to apply a predetermined bias (for example, reset signal). When the reset device 218 is turned on by the bias provided by the reset line RX(i), electrical potential applied to a drain of the reset device 218, for example, source voltage VDD, may be delivered to the floating diffusion region 213.

The selection device 219 selects the pixel P to be read in each row. The selection device 219 can be composed of one MOS transistor driven by a bias provided by a row selection line SEL(i) to apply a predetermined bias (for example, row selection signal). When the selection device 219 is turned on by the bias provided by the row selection line SEL(i), the electrical potential applied to a drain of the selection device 219, for example, the source voltage VDD, is delivered to a drain of the drive device 217.

The transmission line TX(i) to apply a bias to the photoelectric transmission device 215, the reset line RX(i) to apply a bias to the reset device 218, and the row selection line SEL(i) to apply a bias to the reset device 218 can be extended and arranged in parallel to each other in the row direction.

FIGS. 9A through 9G are sectional views of intermediate steps illustrating a method of fabricating an image sensor using the method of fabricating a copper interconnection according to the first and the second exemplary embodiments of the present invention. FIGS. 9A through 9G mainly illustrate a photoelectric transformation device and surrounding devices.

Figure 9A:
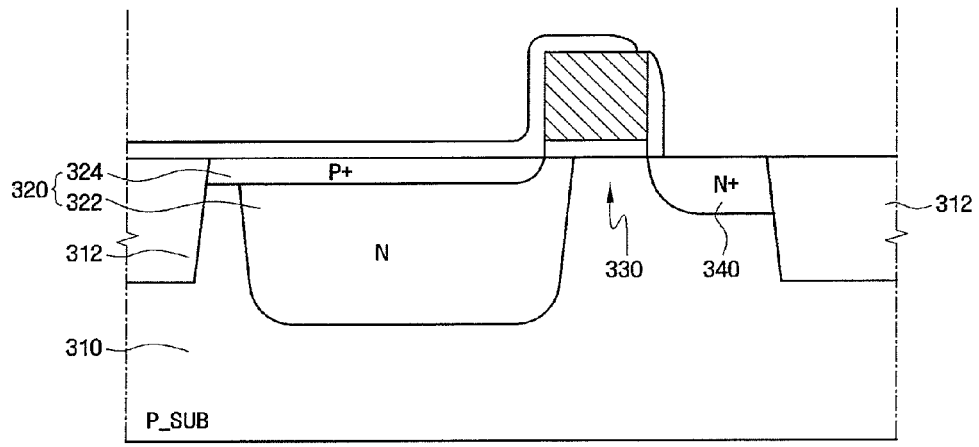
FIGS. 9A through 9G are sectional views of intermediate steps illustrating a method of fabricating an image sensor using the method of fabricating a copper interconnection according to the exemplary embodiments of FIG. 1 and FIG. 3 of the present invention.

First, referring to FIG. 9A, multiple pixels are formed on the substrate 310.

For example, a device isolation region 312 including STI (Shallow Trench Isolation) and DTI (Deep Trench Isolation) is formed on the substrate 310 to define an active region on the substrate 310. The substrate 310 can be a first conductive type (for example, P-type), and an epitaxial layer of the first conductive type can be grown on the substrate 310.

Next, a photoelectric transformation device 320, a floating diffusion region 340, and multiple transistors are formed in the substrate 310. Here, multiple transistors can include a charge transmission device 330, a driver device, a reset device, and a selection device. In FIG. 9A, a pinned photodiode is shown as an example of the photoelectric transformation device 320. Thus, the photoelectric transformation device 320 can be comprised of an impurity region 322 of a second conductive type (for example, N-type) and an impurity region 324 of the first conductive type (for example, P-type).

Figure 9B:
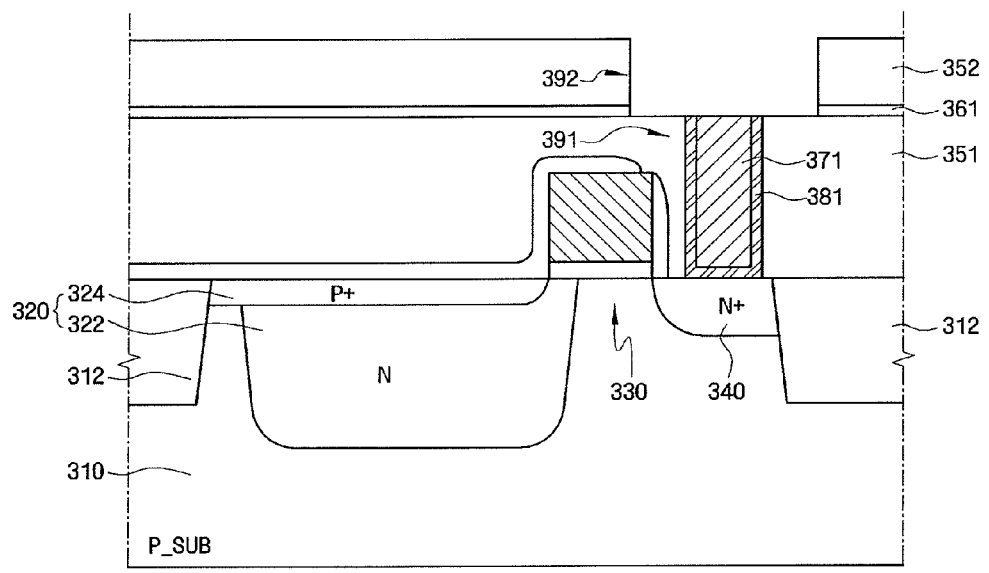

Referring to FIG. 9B, an interlayer dielectric layer 351 is formed on the substrate 310 which multiple pixels are formed in.

Then, a contact hole 391 to expose the floating diffusion region 340 is formed.

Next, a barrier metal layer 381 is conformally formed on sides and a bottom of the contact hole 391 and an upper side of the interlayer dielectric layer 351. The barrier metal layer 381 can be formed of a metal that does not react with copper or copper alloy or a high fusion point metal. For example, the barrier metal layer 381 can be formed of one of Ti, Ta, W, Ru, TiN, TaN, WN, TiZrN, TiSiN, TaAlN, TaSiN, $TaSi_2$, and TiW, and it also can be formed of combinations or a stacked layer of these materials.

Then, a conductive layer is formed on the barrier metal layer 381 to fill the contact hole 391 by, for example, depositing copper, titanium, tungsten, and so on. A contact 371 is formed by, for example, planarizing the conductive layer and the barrier metal layer 381 to expose an upper side of the interlayer dielectric layer 351. In the case titanium or tungsten is used as the contact 371, the barrier metal layer 381 may not be used.

Next, a diffusion barrier layer 361 and an interlayer dielectric layer 352 are formed. The diffusion barrier layer 361 prevents copper diffusion and can act as an etching stopper during an etching process.

Then, using a plasma etching process, an interconnection formation region 392 is formed in the interlayer dielectric layer 352. The interconnection formation region 392 illustrated in FIG. 9B is a region to form a single damascene interconnection.

Next, a ultraviolet (UV) treatment 410 is performed on the substrate 310. As described above, when the interconnection formation region 392 is formed by plasma etching process, various damages can occur. For example, stress applied to the photoelectric transformation device 320 can change. Also, charges can be generated on a surface of the photoelectric transformation device 320, on a boundary between the device isolation region 312 and the substrate 310, and on the boundary between the substrate 310 and charge transmission device 330.

Such damage can increase a dark level of output signals. The pixel provides an output signal through an output line Vout, and the output signal can be divided into a signal level and the dark level. The signal level indicates a voltage value corresponding to charges generated by photoelectric transformation, and the dark level indicates a voltage value corresponding to charges generated by means other than photoelectric transformation (for example, charges generated by heat or other offsets). Therefore, such damage should be repaired.

Damage described above can be repaired by performing the UV treatment 410. The charges generated on the surface of the photoelectric transformation device 320, the charges generated on the boundary between the device isolation region 312 and the substrate 310, and the charges on the boundary between the substrate 310 and the charge transmission device 330 can be removed. Thus, the dark level of the output signals generated by the pixels can be reduced.

The UV treatment 410 can be performed, for example, at a temperature between about 50° C. and about 200° C. for about 10 seconds to about 300 seconds but it is not limited to this. Also, the UV treatment 410 can be performed, for example, using UV bake equipment but it is not limited to this.

Also, the UV treatment 410 can be performed multiple times.

Figure 9C:
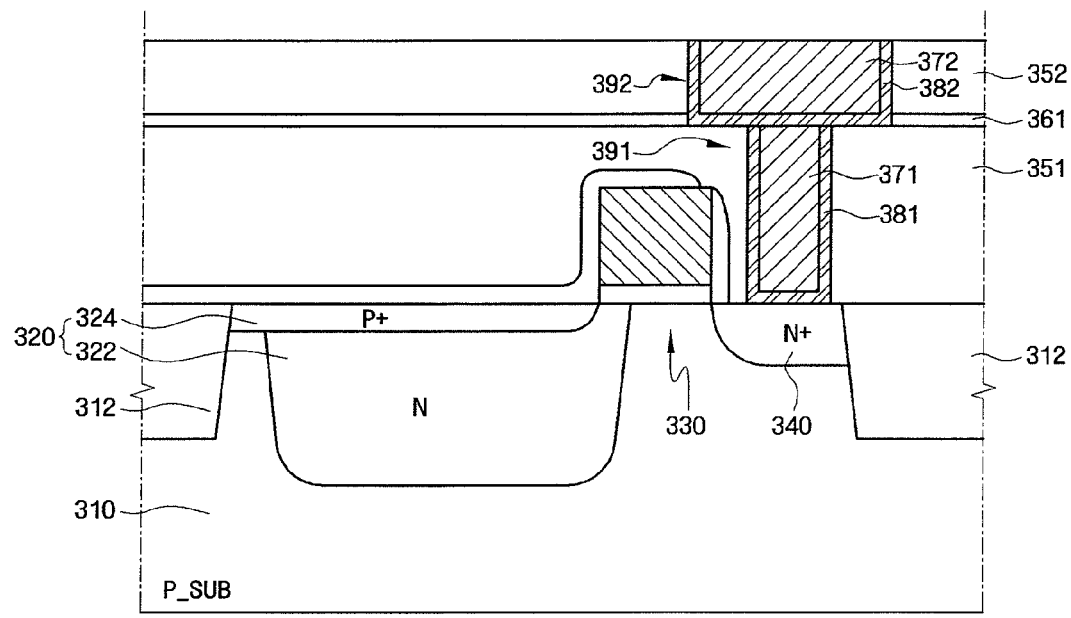

Referring to FIG. 9C, a barrier metal layer 382 and a metal interconnection 372 (that is, a single damascene interconnection) are formed in the interconnection formation region 392. Here, the metal interconnection 372 can be formed with, for example, copper.

Figure 9D:
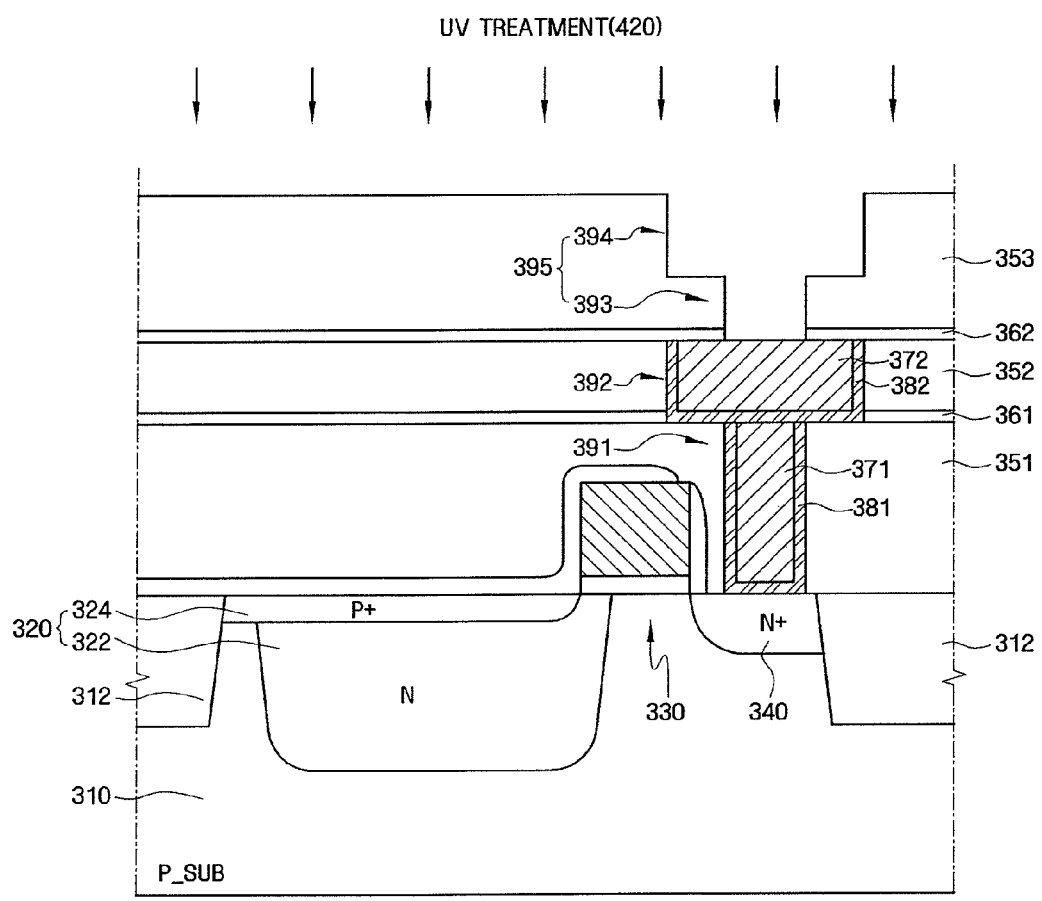

Referring to FIG. 9D, a diffusion barrier layer 362 and an interlayer dielectric layer 353 are formed on the interlayer dielectric layer 352 where the metal interconnection 372 is formed.

Next, an interconnection formation region 395 is formed in an interlayer dielectric layer 353 to form a dual damascene interconnection. The interconnection formation region 395 includes a via hole 393 and a trench 394. For example, the via hole 393 can be formed first in a predetermined area of the interlayer dielectric layer 395, and then the trench 394 which goes through an upper side of the via hole 393 can be formed. Alternatively, the trench 394 can be formed first, and then the via hole 393 can be formed. The interconnection formation region 395 (that is, the via hole 393 and the trench 394) can be formed by, for example, using a plasma etching process.

Then, an UV treatment 420 is performed on the substrate 310. By performing the UV treatment 420, the damage caused by the plasma etching process can be removed.

Figure 9E:
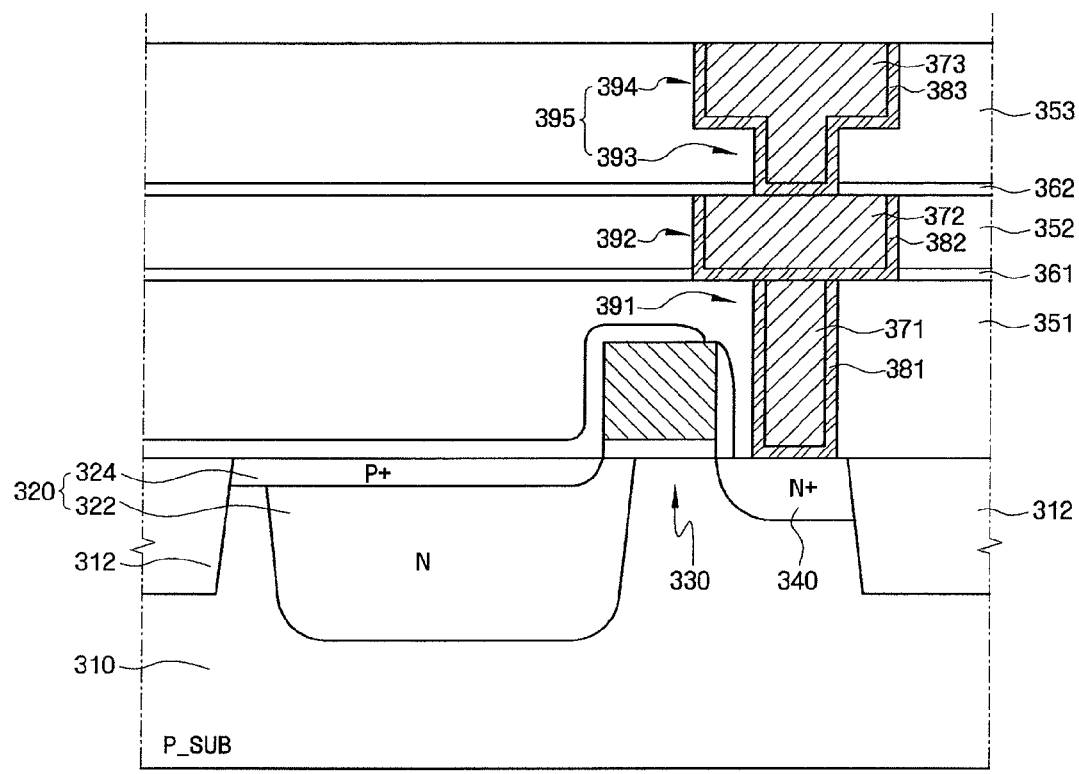

Referring to FIG. 9E, a barrier metal layer 383 and a metal interconnection 373 (that is, a dual damascene interconnection) are formed in the interconnection formation region 395. Here, the metal interconnection 373 can be formed with, for example, copper.

Figure 9F:
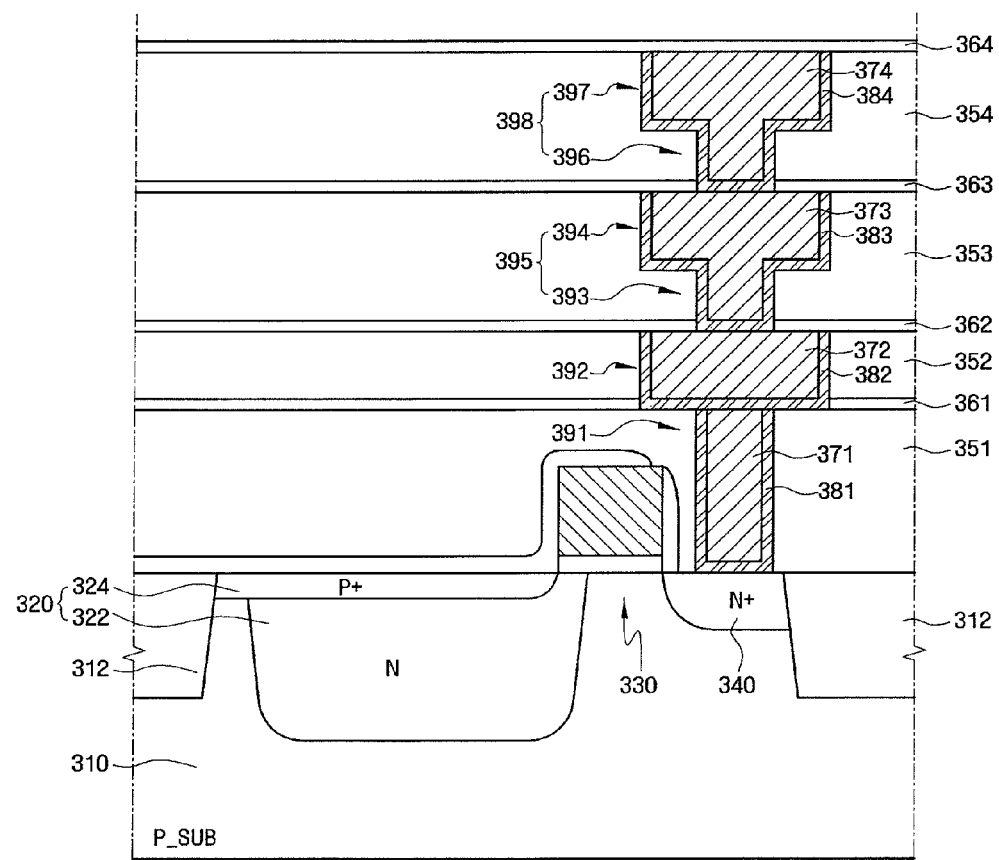

Referring to FIG. 9F, as illustrated in FIGS. 9D and 9F, a diffusion barrier layer 363 and an interlayer dielectric layer 354 are formed on the interlayer dielectric layer 353 where the metal interconnection 373 is formed.

Next, an interconnection formation region 398 including a via hole 396 and a trench 397 is formed in the interlayer dielectric layer 354.

Then, an UV treatment is performed on the substrate.

Next, a barrier metal layer 384 and a metal interconnection 374 (that is, a dual damascene interconnection) are formed in the interconnection formation region 398.

Then, a diffusion barrier layer 364 is formed.

Figure 9G:
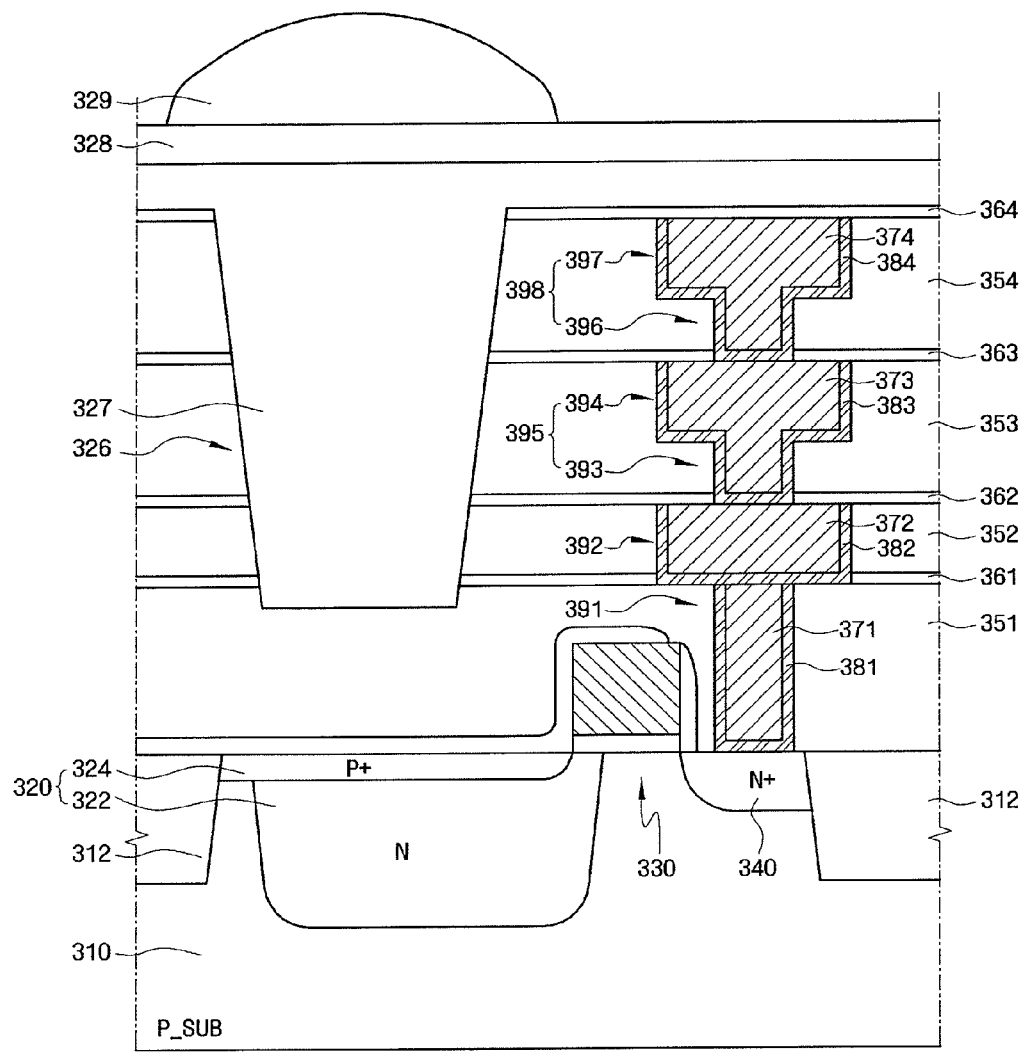

Referring to FIG. 9G, a cavity 326 that penetrates the interlayer dielectric layers 351, 352, 353, 354 and the diffusion barrier layers 361, 362, 363, 364 is formed on the photoelectric transformation device 320.

For example, as the silicon nitride layer used as a diffusion barrier layers 361, 362, 363, 364 has characteristics of low light penetration it can disturb incident light in reaching the photoelectric transformation device 320. Thus, to remove the interlayer dielectric layers 351, 352, 353, 354 and the diffusion barrier layers 361, 362, 363, 364, the cavity 326 is formed. By forming the cavity 326, the amount of the incident light that reaches the photoelectric transformation device 320 can be increased, and also the photo sensitivity can be increased.

As illustrated in FIG. 9G, although the cavity 326 can be formed by removing a part of the interlayer dielectric layer 351, it is not limited to this. Also, as illustrated in FIG. 9G, the cavity 326 can be slope-sided and a flat bottom but it is not limited to this. For example, the sides of the cavity 280 can have no slope, and the bottom can have a non-flat shape such as concave or convex.

Next, the cavity 326 is filled with a light penetration material 327.

Although the light penetration material 327 can be composed of organic high molecular compound such as, for example, a fluorine series high molecule having a Cytop™ type ring structure or a high molecule of polymethylmethacrylate (PMMA) class, it is not limited to this. Also, the cavity 326 can be filled with the light penetration material 327 using, for example, a spin coating method; but it is not limited thereto.

Then, a color filter 328 is formed on the light penetration material 327, and then a microlens 329 is formed on the color filter 328 area corresponding to the area of the photoelectric transformation device 320.

Figure 10A:
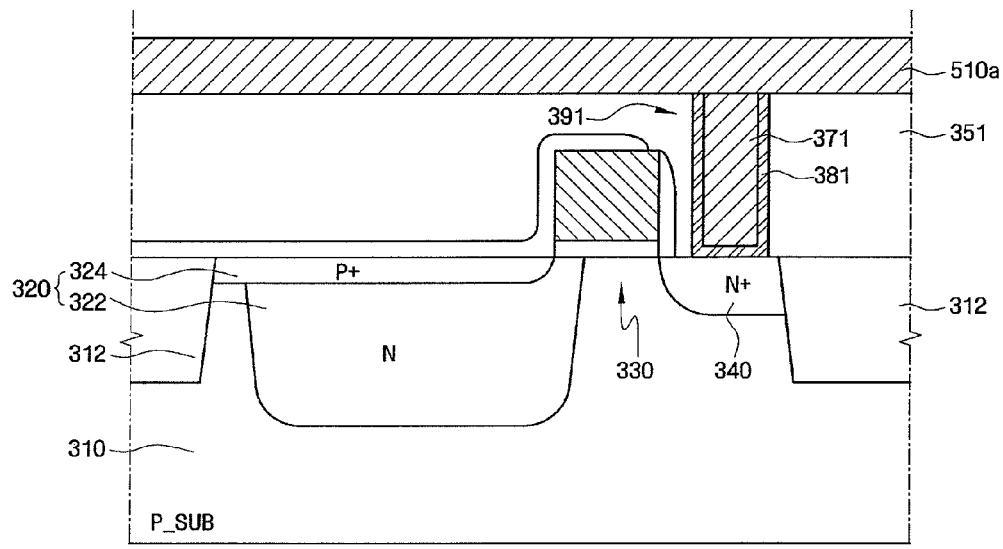
FIGS. 10A through 10C are sectional views of intermediate steps illustrating a method of fabricating an image sensor using the method of fabricating a copper interconnection according to the exemplary embodiments of FIG. 4 and FIG. 6 of the present invention.
Figure 10B:
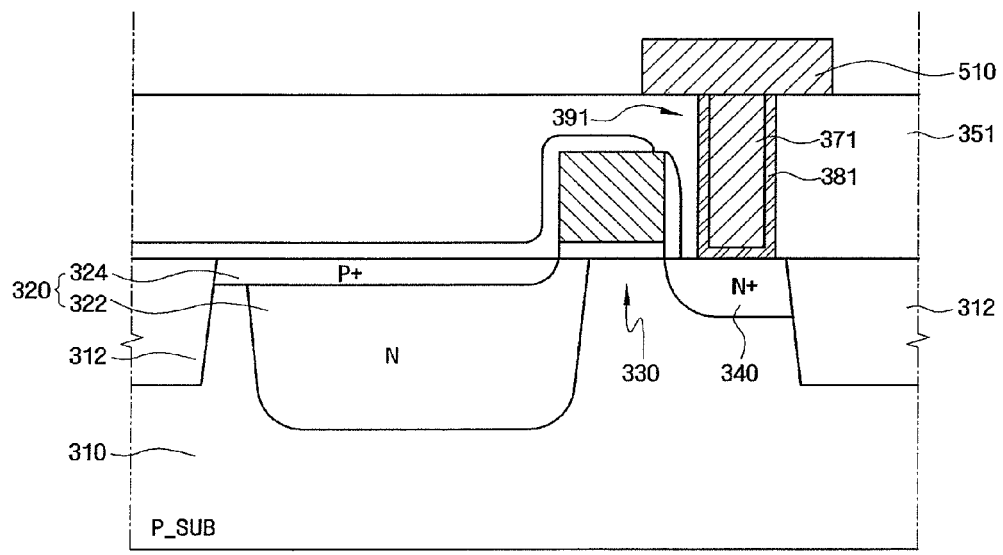
Figure 10C:
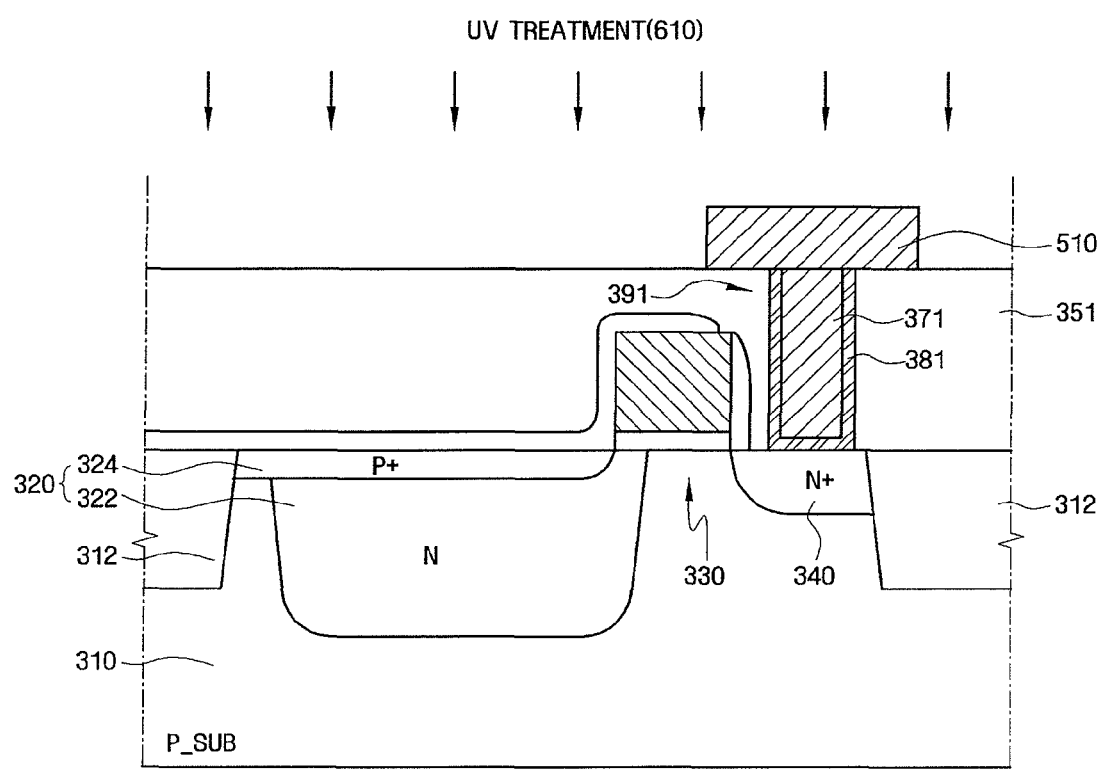

FIGS. 10A through 10C are sectional views of intermediate steps illustrating a method of fabricating an image sensor using the method of fabricating a copper interconnection according to the third and the fourth exemplary embodiments of the present invention.

Referring to FIG. 10A, an interconnection metal layer 510a is formed on an interlayer dielectric layer 351 where a contact 371 is formed. The interconnection metal layer 510a can be formed with, for example, aluminum.

Referring to FIG. 10B, by patterning the interconnection metal layer 510a, a metal interconnection 510 (that is, an aluminum interconnection) is formed on the interlayer dielectric layer 351.

Referring to FIG. 10C, a UV treatment 610 is performed on a substrate. As described above, a plasma etching process used to pattern the interconnection metal layer 510a can cause damage to the substrate, and such damage can be cured by performing the UV treatment 610 on the substrate. For example, charges generated on the surface of the photoelectric transformation device 320, on a boundary between a device isolation region 312 and the substrate 310, and on the boundary between the substrate 310 and a charge transmission device 230 can be removed. Also, the UV treatment 610 can be performed multiple times.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a metal interconnection, comprising:
    forming an interlayer dielectric layer on a substrate;
    forming a interconnection metal layer on the interlayer dielectric layer;
    patterning the interconnection metal layer to form a metal interconnection on the interlayer dielectric layer by plasma etching; and
    performing an ultraviolet (UV) treatment on the substrate after the metal interconnection is formed, wherein the UV treatment is performed at a temperature between about 50° C. to about 200° C. for about 10 seconds to about 300 seconds to cure damage caused to the substrate by the plasma etching.

2. The method of claim 1, wherein the UV treatment is performed multiple times.

3. The method of claim 1, wherein the metal interconnection is an aluminum interconnection.

4. A method of fabricating an image sensor, comprising:
    forming a photoelectric transformation device on a substrate;
        forming an interlayer dielectric layer on the substrate which the photoelectric transformation device is formed on;
    forming a interconnection metal layer on the interlayer dielectric layer;
    patterning the interconnection metal layer to form a metal interconnection on the interlayer dielectric layer by plasma etching; and
    performing an ultraviolet (UV) treatment on the substrate after the metal interconnection is formed, wherein the UV treatment is performed at a temperature between about 50° C. to about 200° C. for about 10 seconds to about 300 seconds to cure damage caused to the substrate by the plasma etching.

5. The method of claim 4, wherein the UV treatment is performed multiple times.

6. The method of claim 4, wherein the metal interconnection is an aluminum interconnection.

7. The method of claim 4, wherein charges generated on a surface of the photoelectric transformation device, on a boundary between a device isolation region and the substrate, and on a boundary between the substrate and a charge transmission device is removed during the ultraviolet (UV) treatment.

* * * * *